(12) United States Patent
Guo

(10) Patent No.: US 9,099,312 B2
(45) Date of Patent: Aug. 4, 2015

(54) ARRAY SUBSTRATE AND MANUFACTURING METHOD THEREOF

(71) Applicant: BEIJING BOE OPTOELECTRONICS TECHNOLOGY CO., LTD., Beijing (CN)

(72) Inventor: Jian Guo, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 47 days.

(21) Appl. No.: 14/104,051

(22) Filed: Dec. 12, 2013

(65) Prior Publication Data

US 2014/0197414 A1    Jul. 17, 2014

(30) Foreign Application Priority Data

Jan. 11, 2013  (CN) .......................... 2013 1 0011529

(51) Int. Cl.

| G02F 1/1333 | (2006.01) |
| H01L 27/02 | (2006.01) |
| G02F 1/1345 | (2006.01) |
| G02F 1/1362 | (2006.01) |
| H01L 21/84 | (2006.01) |

(52) U.S. Cl.
CPC .......... *H01L 27/0292* (2013.01); *G02F 1/1345* (2013.01); *G02F 1/136286* (2013.01); *H01L 21/84* (2013.01)

(58) Field of Classification Search
CPC ........................... G02F 1/136204; G02F 1/345

USPC ................................ 349/40; 257/59; 438/155
See application file for complete search history.

(56) References Cited

U.S. PATENT DOCUMENTS 6,172,733 B1 * 1/2001 Hong et al. .................... 349/152
2006/0023135 A1 * 2/2006 Park ................................ 349/40
(Continued)

FOREIGN PATENT DOCUMENTS

| EP | 0775931 A2 | 5/1997 |
| EP | 2042916 A1 | 4/2009 |

(Continued)

OTHER PUBLICATIONS

Extended European Search Report completed Apr. 11, 2014; EP 14 15 0276.
Korean Office Action dated Dec. 31, 2014; Appln. No. 10-2013-0168408.

*Primary Examiner* — Lex Malsawma
*Assistant Examiner* — Eric Jones
(74) *Attorney, Agent, or Firm* — Ladas & Parry LLP

(57) ABSTRACT

Embodiments of the present invention disclose an array substrate comprising a peripheral wiring area which comprises an electrostatic discharge prevention area. The electrostatic discharge prevention area comprises a substrate on which a gate line, a gate insulating layer, a data line, a protection layer and a transparent electrode are formed. A first through hole is formed in the gate insulating layer, a second through hole is formed at the position of the protection layer corresponding to the first through hole, and the gate line, the data line and the transparent electrode are connected together through the first through hole and the second through hole. The present invention also discloses a manufacturing method of the array substrate.

19 Claims, 2 Drawing Sheets

(56) References Cited

U.S. PATENT DOCUMENTS

| | | | |
|---|---|---|---|
| 2006/0194368 A1* | 8/2006 | Hong et al. | 438/109 |
| 2008/0135846 A1* | 6/2008 | Shin et al. | 257/59 |
| 2009/0109362 A1* | 4/2009 | Chen et al. | 349/40 |
| 2013/0148050 A1* | 6/2013 | Kwon et al. | 349/43 |

FOREIGN PATENT DOCUMENTS

| | | |
|---|---|---|
| GB | 2334619 A | 8/1999 |
| KR | 1019990070487 A | 9/1999 |

* cited by examiner

ARRAY SUBSTRATE AND MANUFACTURING METHOD THEREOF

TECHNICAL FIELD

Embodiments of the present invention relate to an array substrate and a manufacturing method thereof.

BACKGROUND

Currently, liquid crystal display with TFT-LCD as a representative has been an important flat panel display manner. In view of the directions of the electric fields driving the liquid crystal, the TFT-LCD is divided into a vertical electric field type and a horizontal electric field type. The vertical electric field type TFT-LCD comprises a Twist Nematic (TN) type TFT-LCD; the horizontal electric field type TFT-LCD comprises an FFS type TFT-LCD and an In-Plane Switching (IPS) type TFT-LCD.

During the manufacturing of the TFT-LCD array substrate, a protection layer 7 is coated after a data line is formed, as illustrated in FIG. 1. The protection layer 7 covers the whole of the display area (that is, area d), and a resin through hole needs to be formed not only in a common electrode through hole area (that is, area a), but also in a peripheral Electro Static Discharge (ESD) prevention area (that is, area b) and a chip bonding (IC bonding) area (that is, area c). As resin is a planarization material and presents a planarization shape on the whole after being coated and cured. If the bottom layer structure of the resin has sharp fluctuation, differences of the thickness of the resin will be rendered, as illustrated by the four areas a, b, c and d in FIG. 1.

As the resin needs dry etching, the resin in area b is the thinnest, it can be etched in the shortest period, and areas a and c need a longer etching period. Suppose the etching speed of the resin is x and thicknesses of the areas a, b and c are represented by $T_a$, $T_b$ and $T_c$, respectively, the etching period of the three areas can be represented with $T_a/x \cong T_c/x > T_b/x$. When the etching of the area b is finished, the resin in areas a and c is still being etched, thus the bottom layer data line 4 in the area b will be damaged greatly. Suppose the etching speed of the data line is y, the over-etching amount of the data line can be represented with $(T_a/x - T_b/x)*y$. As the data line per se is thin, over-etching will easily render the defect of data line loss, and then product yield is lowered.

SUMMARY

One embodiment of the invention provides an array substrate comprising a peripheral wiring area which comprises an electrostatic discharge prevention area, the electrostatic discharge prevention area comprises a substrate, and a gate line, a gate insulating layer, a data line, a protection layer and a transparent electrode formed on the substrate, wherein, a first through hole is formed in the gate insulating layer, a second through hole is formed at a position of the protection layer corresponding to the first through hole, and the gate line, the data line and the transparent electrode are connected together through the first through hole and the second through hole.

In one example, the transparent electrode comprises a first transparent electrode and a second transparent electrode, a passivation layer is formed between the first transparent electrode and the second transparent electrode, and a third through hole is formed at a position of the passivation layer corresponding to the first through hole.

In one example, one of the first transparent electrode and the second transparent electrode located at an upper layer is a slit electrode.

In one example, the material of the protection layer is an organic resin.

In one example, the organic resin is one of, or a mixture of two of organic resins with Si—C or Si—O as a main chain.

In one example, the array substrate further comprises a common electrode through hole area which comprises the gate line, the gate insulating layer, a gate line protection layer, the protection layer and the transparent electrode formed on the substrate, wherein.

the gate insulating layer is formed with a fourth through hole, the protection layer is formed with a fifth through hole at a position corresponding to the fourth through hole, and the gate line, the gate line protection layer and the transparent electrode are connected together through the fourth through hole and the fifth through hole.

In one example, the array substrate further comprises a chip bonding area which comprises the gate insulating layer, the data line, the protection layer and the transparent electrode formed on the substrate, wherein, the protection layer is formed with a seventh through hole through which the data line and the transparent electrode are connected together.

Another embodiment of the invention provides a manufacturing method of an array substrate comprising a peripheral wiring area which comprises an electrostatic discharge prevention area, wherein, a step of forming the electrostatic discharge prevention area comprises forming a gate line, a gate insulating layer, a data line, a protection layer and a transparent electrode on a substrate, wherein, the method further comprises: etching a first through hole in the gate insulating layer, etching a second through hole at a position of the protection layer corresponding to the first through hole, so that the gate line, the data line and the transparent electrode are connected together through the first through hole and the second through hole.

In one example, the transparent electrode comprises a first transparent electrode and a second transparent electrode; the method further comprises: forming a passivation layer between the first transparent electrode and the second transparent electrode, and etching a third through hole at a position of the passivation layer corresponding to the first through hole.

In one example, a material of the protection layer is an organic resin.

In one example, the organic resin is one of, or a mixture of two of organic resins with Si—C or Si—O as a main chain.

In one example, a step of curing the organic resin is contained when the organic resin is deposited, wherein, a condition for curing the organic resin is baking the organic resin at a temperature above 250° C. and then curing.

In one example, a dry etching method is used to etch the organic resin; wherein, the dry etching method is as follow:

a1, conducting etching with a mixture gas of $SF_6$, $O_2$ and He at a power of 7000 W-12000 W; and a2, after etching the organic resin part, conducting etching with a mixture gas of $SF_6$ and He at a power of 5000 W-10000 W.

In one example, the array substrate further comprises a common electrode through hole area, and a step of forming the common electrode through hole area comprises forming the gate line, the gate insulating layer, a gate line protection layer, the protection layer and the transparent electrode on the substrate, wherein, a fourth through hole is etched in the gate insulating layer, a fifth through hole is etched at a position of the protection layer corresponding to the fourth through hole, and the gate line, the gate line protection layer and the transparent electrode are connected together through the fourth through hole and the fifth through hole.

In one example, the array substrate further comprises a chip bonding area, and a step of forming the chip bonding area comprises forming the gate insulating layer, the data line, the protection layer and the transparent electrode on the substrate, wherein, a seventh through hole is etched in the protection layer, and the data line and the transparent electrode are connected together through the seventh through hole.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 4 is a diagram of a structure of the array substrate of the improved area a;

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
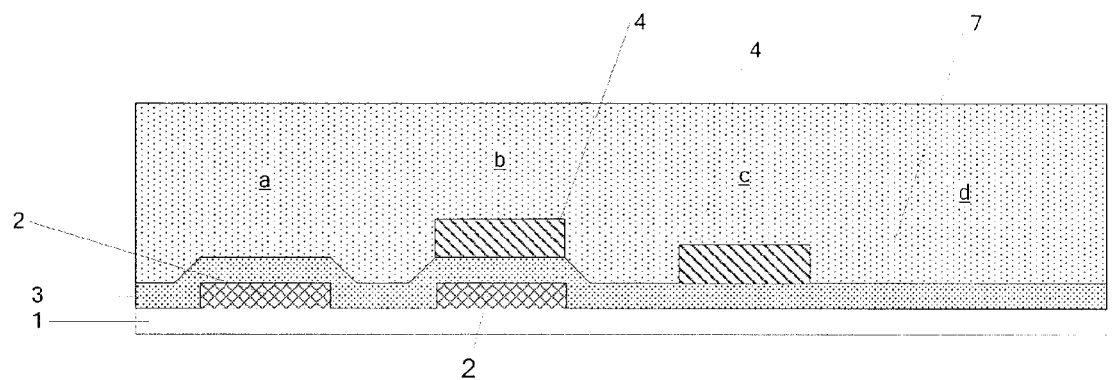
FIG. 1 is a diagram of a structure of an array substrate after a protection layer is deposited.
Figure 2:
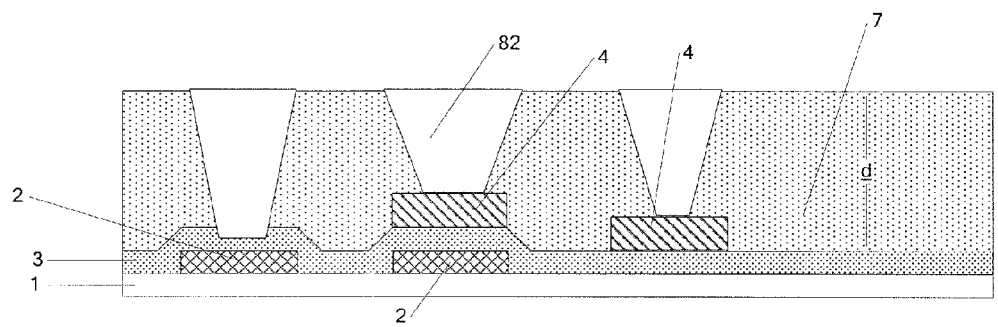
FIG. 2 is a diagram of a structure of the array substrate after the protection layer is etched.

From FIGS. 1 and 2, the different thicknesses of the areas a, b and c render the over-etching of the bottom layer data line of the area b, thus, to ensure consistent thickness of the areas a, b and c during etching the resin, the overall structure needs to be improved.

For example, the area a is a common electrode through hole area, the area b is an ESD prevention area, and the area c is a chip bonding area.

Figure 3:
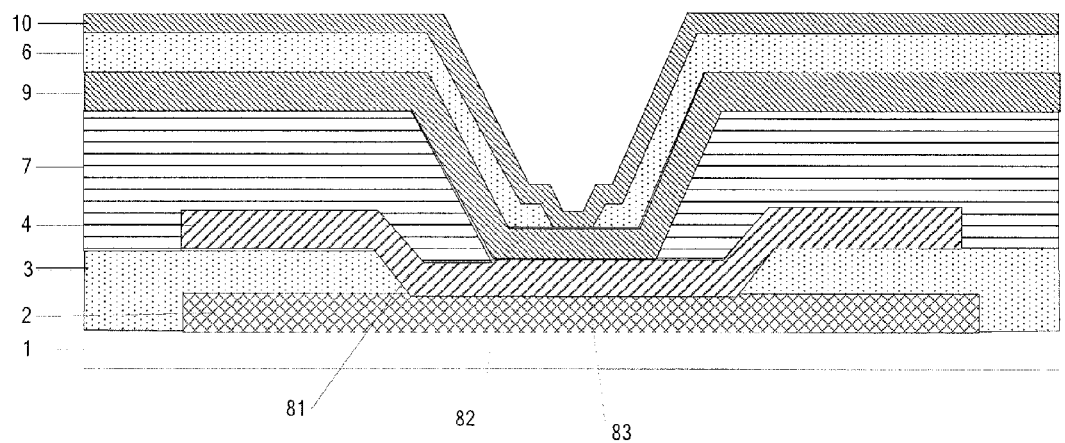
FIG. 3 is a diagram of a structure of the array substrate of the improved area b.

FIG. 3 is a diagram of a structure of an array substrate of the improved area b. As can be seen from FIG. 3, the structure of the array substrate of the improved area b comprises: a substrate 1, a gate line 2, a gate insulating layer 3, a data line 4, a passivation layer 6, a protection layer 7, a first transparent electrode 9, a second transparent electrode 10, a first through hole 81, a second through hole 82 and a third through hole 83.

The gate line 2 is formed on the substrate 1. The gate insulating layer 3 is formed on the gate line 2 and covers the substrate 1. The first through hole 81 passes through the gate insulating layer 3. The data line 4 is formed on the gate insulating layer 3 and is connected with the gate line 2 through the first through hole 81. The protection layer 7 is formed on the data line 4. The second through hole 82 passes through the protection layer 7. The first transparent electrode 9 is formed on the protection layer 7 and connected with the data line 4 through the first through hole 81 and the second through hole 82. The passivation layer 6 is formed on the first transparent electrode 9. The third through hole 83 passes through the passivation layer 6. The second transparent electrode 10 is formed on the passivation layer 6 and is connected with the first transparent electrode 9 through the third through hole 83.

In the above solution, the thickness of the lower layer of the area b can be lowered and the thickness of the area b can be increased by etching the gate insulating layer at the first through hole 81, thus the consistency of the thicknesses of the areas a, b and c can be ensured, and the over-etching of the data line 4 of the area b during forming the through hole in the protection layer 7 can be avoided. Also, the transparent conductive material of the first transparent electrode 9 will not be etched, thus, forming the first transparent electrode 9 on the protection layer 7 can further prevent etching the data line 4 when forming the through hole of the passivation layer 6.

Figure 4:
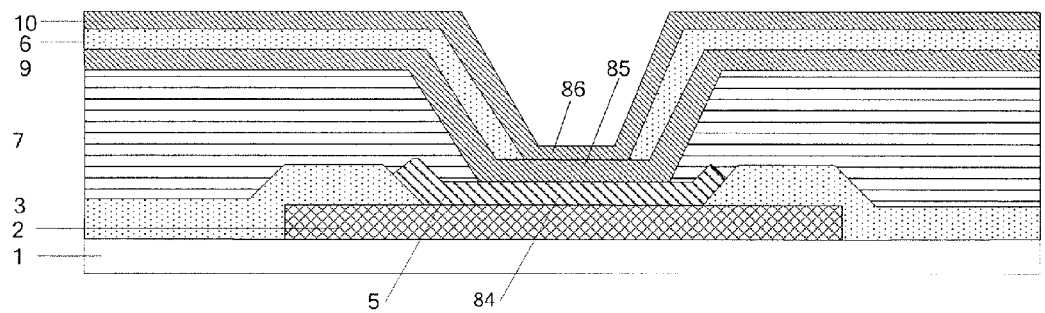
Figure 5:
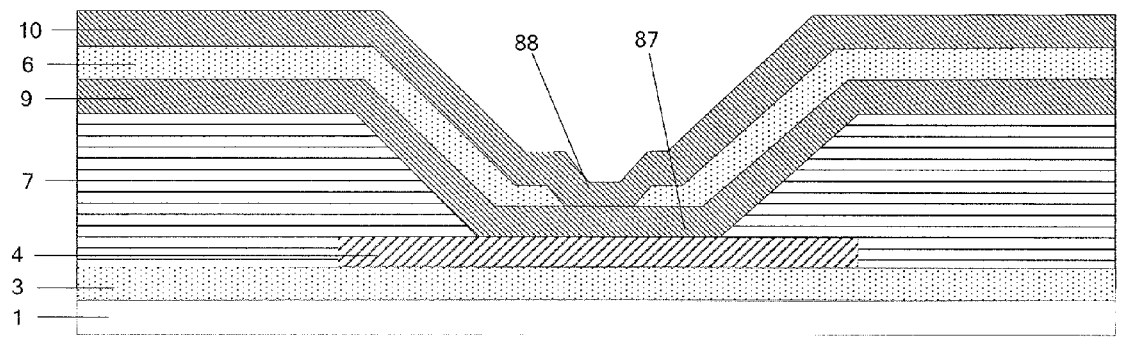
FIG. 5 is a diagram of a structure of the array substrate of the improved area c.

FIGS. 4 and 5 are diagrams of the structures of the array substrate of the improved areas a and c, respectively. As can be seen from FIG. 4, the structure of the array substrate of the improved area a comprises: the substrate 1, the gate line 2, the gate insulating layer 3, the gate line protection layer 5, the passivation layer 6, the protection layer 7, the first transparent electrode 9, the second transparent electrode 10, a fourth through hole 84, a fifth through hole 85 and a sixth through hole 86.

The gate line 2 is formed on the substrate 1. The gate insulating layer 3 is formed on the gate line 2 and covers the substrate 1. The fourth through hole 84 passes through the gate insulating layer 3. The gate line protection layer 5 is formed on the fourth through hole 84 and connected with the gate line 2 through the fourth through hole 84. The protection layer 7 is formed on the gate insulating layer 3 and the gate line protection layer 5. The fifth through hole 85 passes through the protection layer 7. The first transparent electrode 9 is formed on the protection layer 7 and connected with the gate line protection layer 5 through the fourth through hole 84 and the fifth through hole 85. The passivation layer 6 is formed on the first transparent electrode 9. The sixth through hole 86 passes through the passivation layer 6. The second transparent electrode 10 is formed on the passivation layer 6 and is connected with the first transparent electrode 9 through the sixth through hole 86.

As can be seen from FIG. 5, the structure of the array substrate of the improved area c comprises: the substrate 1, the gate insulating layer 3, the data line 4, the passivation layer 6, the protection layer 7, a seventh through hole 87, a eighth through hole 88, the first transparent electrode 9 and the second transparent electrode 10.

The gate insulating layer 3 is formed on the substrate 1. The data line 4 is formed on the gate insulating layer 3. The protection layer 7 is formed on the data line 4 and covers the gate insulating layer 3. The seventh through hole 87 passes through the protection layer 7. The first transparent electrode 9 is formed on the protection layer 7 and connected with the data line 4 through the seventh through hole 87. The passivation layer 6 is formed on the first transparent electrode 9. The eighth through hole 88 passes through the passivation layer 6. The second transparent electrode 10 is formed on the passivation layer 6 and is connected with the first transparent electrode 9 through the eighth through hole 88.

The first transparent electrode 9 is added in both of the improved areas a and c and will not be etched, thus, the over-etching of the bottom layer gate line and the bottom layer data line during forming the through hole in the passivation layer can be prevented.

Herein, it should be noted that the material of the protection layer can be an organic resin, and the organic resin is one of, or the mixture of two of organic resins with Si—C or Si—O as a main chain. The material of the first transparent electrode can be a transparent conductive material which is a nano indium tin metal oxide or indium zinc metal oxide. The one of the first transparent electrode and the second transparent electrode located at an upper layer, that is, the second transparent electrode, is a slit electrode.

The above common electrode through hole area, the ESD prevention area and the chip bonding area are all located in the peripheral area of the array substrate. The gate line, the gate insulating layer, the data line, the transparent electrode and etc. in the above area are parts the gate line, the gate insulating layer, the data line and the transparent electrode extending from the display area to the peripheral area. However, according to needs, the parts of such components in the display area and the parts of the peripheral area can be connected or disconnected. In addition, the gate line or data line in the common electrode through hole area, the ESD prevention area and the chip bonding area can be different parts of the same gate line and the same data line, and in addition, the parts of the gate line or data line in respective areas can be connected or disconnected.

Actually, the parts of the gate line and the data line extending to the peripheral wiring region play a major function of leads, so that they can be referred to as a gate line lead and a data line lead. However, since the present invention mainly describes the structure of the peripheral wiring region, for the convenience of description, they are just called as the gate line and the data line. As described above, the components in the peripheral regions and the display region of the array substrate may be connected or disconnected according to need, therefore, in each region, the conductive components may be connected to each other to facilitate signal transmission. For example, in one peripheral wiring region, the gate line can be connected with the data line and the transparent conductive layer thereon for signal transmission. In this case, the data line and the transparent conductive layer in the region can be disconnected with the data line and the transparent conductive layer in other regions.

Based on the above structure of the array substrate, the embodiments of the present invention further provide a manufacturing method of the structure of the array substrate comprising the improved area b illustrated in FIG. 3, comprising following steps:

Step 1, forming a gate line on a substrate, forming a gate insulating layer on the gate line, and the gate insulating layer covering the substrate;

Step 2, at positions requiring preparation of a through hole, conducting processes of exposing, developing and etching to etch a first through hole in the gate insulating layer;

Step 3, forming a data line so that the data line is formed on the gate insulating layer and is connected with the gate line through the first through hole;

Step 4, forming an organic resin layer which is formed on the data line, then, after baking the organic resin at a temperature above 250° C. and then curing it, conducting exposing, developing and dry etching at a position of the protection layer corresponding to the first through hole to etch a second through hole;

The steps of the dry etching, for example, are as follow: first, conducting etching with a mixture gas of $SF_6$, $O_2$ and He at a power more than 7000 W (e.g., 7000 W-12000 W); second, after etching the organic resin part is finished, conducting etching with a mixture gas of $SF_6$ and He at a power of 5000 W-12000 W;

Step 5, forming a first transparent electrode which is formed on the protection layer and connected with the data line through the first through hole and the second through hole;

Step 6, forming a passivation layer which is formed on the first transparent electrode, and conducting exposing, developing and etching at a position of the passivation layer corresponding to the first through hole to etch a third through hole; and Step 7, forming the second transparent electrode which is formed on the passivation layer and connected with the first transparent electrode through the third through hole.

The embodiments of the present invention further provide a manufacturing method of the structure of the array substrate comprising the improved area a illustrated in FIG. 4, comprising following steps:

Step 1, forming a gate line on a substrate, forming a gate insulating layer on the gate line, and the gate insulating layer covering the substrate;

Step 2, at positions requiring preparation of a through hole, conducting processes of exposing, developing and etching to etch a fourth through hole in the gate insulating layer;

Step 3, forming a gate line protection layer which is formed on the fourth through hole and connected with the gate line through the fourth through hole;

Step 4, forming an organic resin layer which is formed on the gate insulating layer and the gate line protection layer, then, after baking the organic resin at a temperature above 250° C. and then curing it, conducting exposing, developing and dry etching at a position of the organic resin layer corresponding to the fourth through hole to etch a fifth through hole;

The steps of the dry etching, for example, are as follow: first, conducting etching with a mixture gas of $SF_6$, $O_2$ and He at a power more than 7000 W; second, after etching the organic resin part is finished, conducting etching with a mixture gas of $SF_6$ and He at a power of 5000 W-10000 W;

Step 5, forming a first transparent electrode which is formed on the organic resin layer and connected with the gate line protection layer through the fourth through hole and the fifth through hole;

Step 6, forming a passivation layer which is formed on the first transparent electrode, and conducting exposing, developing and etching at a position of the passivation layer corresponding to the fourth through hole to etch a sixth through hole; and Step 7, forming a second transparent electrode which is formed on the passivation layer and connected with the first transparent electrode through the sixth through hole.

The embodiments of the present invention further provide a manufacturing method of the structure of the array substrate comprising the improved area c illustrated in FIG. 5, comprising following steps:

Step 1, forming a gate insulating layer on a substrate, forming a data line on the gate insulating layer;

Step 2, forming an organic resin layer which is formed on the data line so that the organic resin layer covers the gate insulating layer, and after baking the organic resin at a temperature above 250° C. and then curing it, conducting exposing, developing and dry etching at a position requiring preparation of a through hole, and etching a seventh through hole in the organic resin layer;

The steps of the dry etching, for example, are as follow: first, conducting etching with a mixture gas of $SF_6$, $O_2$ and He at a power more than 7000 W; second, after etching the organic resin part is finished, conducting etching with a mixture gas of $SF_6$ and He at a power of 5000 W-12000 W;

Step 3, forming a first transparent electrode which is formed on the organic resin layer and connected with the data line through the seventh through hole;

Step 4, forming a passivation layer which is formed on the first transparent electrode, and conducting exposing, developing and etching at a position of the passivation layer corresponding to the seventh through hole to etch an eighth through hole; and Step 5, forming a second transparent electrode which is formed on the passivation layer and connected with the first transparent electrode through the eighth through hole.

Based on the above three production flows, the manufacturing method of the structure of the array substrate comprising the areas a, b and c can be achieved.

Herein, it should be noted that, in the above producing method, the material of the protection layer can be an organic resin, and the organic resin is one of, or the mixture of two of organic resins with Si—C or Si—O as a main chain. Therefore, in the above producing method, the embodiments collectively refer to the protection layer as the organic resin layer.

The array substrate and the manufacturing method thereof provided by the embodiments of the present invention have following advantages and features:

Forming the through hole in the gate insulating layer and depositing the data line at this position can reduce the thickness of this area and then effectively avoid over-etching the data line during etching the protection layer; and Through depositing the first transparent electrode on the through hole of the projection layer, when the through hole is etched in the passivation layer, the first transparent electrode can serve as a protection layer and achieve the function of blocking etching the bottom layer data line, and further prevent over-etching the data line.

The present invention uses an organic resin material with a low dielectric constant as the protection layer at a pixel area, which can improve the surface smoothness of the TFT-LCD substrate, and then helps design a product with a large aperture rate.

The foregoing is merely exemplary embodiments of the invention, but is not used to limit the protection scope of the invention. The protection scope of the invention shall be defined by the attached claims.

What is claimed is:

1. An array substrate comprising a peripheral wiring area which comprises an electrostatic discharge prevention area, the electrostatic discharge prevention area comprises a substrate, and a gate line, a gate insulating layer, a data line, a protection layer and a transparent electrode formed on the substrate, wherein,
a first through hole is formed in the gate insulating layer, a second through hole is formed at a position of the protection layer corresponding to the first through hole, and the gate line, the data line and the transparent electrode are connected together through the first through hole and the second through hole.

2. The array substrate according to claim 1, wherein, the transparent electrode comprises a first transparent electrode and a second transparent electrode, a passivation layer is formed between the first transparent electrode and the second transparent electrode, and a third through hole is formed at a position of the passivation layer corresponding to the first through hole.

3. The array substrate according to claim 2, wherein, the array substrate further comprises a common electrode through hole area which comprises the gate line, the gate insulating layer, a gate line protection layer, the protection layer and the transparent electrode formed on the substrate, wherein,
the gate insulating layer is formed with a fourth through hole, the protection layer is formed with a fifth through hole at a position corresponding to the fourth through hole, and the gate line, the gate line protection layer and the transparent electrode are connected together through the fourth through hole and the fifth through hole.

4. The array substrate according to claim 2, wherein, the array substrate further comprises a chip bonding area which comprises the gate insulating layer, the data line, the protection layer and the transparent electrode formed on the substrate, wherein,
the protection layer is formed with a seventh through hole through which the data line and the transparent electrode are connected together.

5. The array substrate according to claim 1, wherein, one of the first transparent electrode and the second transparent electrode located at an upper layer is a slit electrode.

6. The array substrate according to claim 1, wherein, the material of the protection layer is an organic resin.

7. The array substrate according to claim 6, wherein, the organic resin is one of, or a mixture of two of organic resins with Si—C or Si—O as a main chain.

8. The array substrate according to claim 1, wherein, the array substrate further comprises a common electrode through hole area which comprises the gate line, the gate insulating layer, a gate line protection layer, the protection layer and the transparent electrode formed on the substrate, wherein,
the gate insulating layer is formed with a fourth through hole, the protection layer is formed with a fifth through hole at a position corresponding to the fourth through hole, and the gate line, the gate line protection layer and the transparent electrode are connected together through the fourth through hole and the fifth through hole.

9. The array substrate according to claim 1, wherein, the array substrate further comprises a chip bonding area which comprises the gate insulating layer, the data line, the protection layer and the transparent electrode formed on the substrate, wherein,
the protection layer is formed with a seventh through hole through which the data line and the transparent electrode are connected together.

10. A manufacturing method of an array substrate comprising a peripheral wiring area which comprises an electrostatic discharge prevention area, wherein, a step of forming the electrostatic discharge prevention area comprises forming a gate line, a gate insulating layer, a data line, a protection layer and a transparent electrode on a substrate, wherein, the method further comprises: etching a first through hole in the gate insulating layer, etching a second through hole at a position of the protection layer corresponding to the first through hole, so that the gate line, the data line and the transparent electrode are connected together through the first through hole and the second through hole.

11. The method according to claim 10, wherein, the transparent electrode comprises a first transparent electrode and a second transparent electrode; the method further comprises: forming a passivation layer between the first transparent electrode and the second transparent electrode, and etching a third through hole at a position of the passivation layer corresponding to the first through hole.

12. The method according to claim 11, wherein, the array substrate further comprises a common electrode through hole area, and a step of forming the common electrode through hole area comprises forming the gate line, the gate insulating layer, a gate line protection layer, the protection layer and the transparent electrode on the substrate, wherein,
- a fourth through hole is etched in the gate insulating layer, a fifth through hole is etched at a position of the protection layer corresponding to the fourth through hole, and the gate line, the gate line protection layer and the transparent electrode are connected together through the fourth through hole and the fifth through hole.

13. The method according to claim 11, wherein, the array substrate further comprises a chip bonding area, and a step of forming the chip bonding area comprises forming the gate insulating layer, the data line, the protection layer and the transparent electrode on the substrate, wherein,
- a seventh through hole is etched in the protection layer, and the data line and the transparent electrode are connected together through the seventh through hole.

14. The method according to claim 10, wherein, a material of the protection layer is an organic resin.

15. The method according to claim 14, wherein, the organic resin is one of, or a mixture of two of organic resins with Si—C or Si—O as a main chain.

16. The method according to claim 14, wherein, a step of curing the organic resin is contained when the organic resin is deposited, wherein, a condition for curing the organic resin is baking the organic resin at a temperature above 250° C. and then curing.

17. The method according to claim 14, wherein, a dry etching method is used to etch the organic resin; wherein, the dry etching method is as follow:
- a1, conducting etching with a mixture gas of $SF_6$, $O_2$ and He at a power of 7000 W-12000 W; and
- a2, after etching the organic resin part, conducting etching with a mixture gas of $SF_6$ and He at a power of 5000 W-10000 W.

18. The method according to claim 10, wherein, the array substrate further comprises a common electrode through hole area, and a step of forming the common electrode through hole area comprises forming the gate line, the gate insulating layer, a gate line protection layer, the protection layer and the transparent electrode on the substrate, wherein,
- a fourth through hole is etched in the gate insulating layer, a fifth through hole is etched at a position of the protection layer corresponding to the fourth through hole, and the gate line, the gate line protection layer and the transparent electrode are connected together through the fourth through hole and the fifth through hole.

19. The method according to claim 10, wherein, the array substrate further comprises a chip bonding area, and a step of forming the chip bonding area comprises forming the gate insulating layer, the data line, the protection layer and the transparent electrode on the substrate, wherein,
- a seventh through hole is etched in the protection layer, and the data line and the transparent electrode are connected together through the seventh through hole.

\* \* \* \* \*